(12) United States Patent
Oh et al.

(10) Patent No.: US 7,606,284 B2
(45) Date of Patent: Oct. 20, 2009

(54) SEMICONDUCTOR LASER STRUCTURE INCLUDING QUANTUM DOT

(75) Inventors: Dae Kon Oh, Daejeon (KR); Jin Hong Lee, Daejeon (KR); Jin Soo Kim, Daejeon (KR); Sung Ui Hong, Daejeon (KR); Ho Sang Kwack, Chungcheongnam-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/595,470

(22) Filed: Nov. 9, 2006

(65) Prior Publication Data

US 2007/0133639 A1 Jun. 14, 2007

(30) Foreign Application Priority Data

Dec. 5, 2005 (KR) .................. 10-2005-0117714
Sep. 5, 2006 (KR) .................. 10-2006-0084913

(51) Int. Cl.
*H01S 3/08* (2006.01)

(52) U.S. Cl. .................. 372/96; 372/43.01; 372/99; 372/102

(58) Field of Classification Search .............. 372/43.01, 372/50.1, 50.11, 96, 99, 102
See application file for complete search history.

(56) References Cited

U.S. PATENT DOCUMENTS 5,065,406 A * 11/1991 Kinoshita .................. 372/96
6,219,369 B1   4/2001 Portnoi et al.
6,421,363 B1 * 7/2002 Osinski et al. .......... 372/50.11
6,577,660 B1   6/2003 Muroya
6,810,053 B1  10/2004 Botez et al.
6,885,804 B2 * 4/2005 Park et al. .................. 385/131
2002/0114367 A1 * 8/2002 Stintz et al. .................. 372/45

FOREIGN PATENT DOCUMENTS

| JP | 62-144378 | 6/1987 |
| JP | 2000-058970 | 2/2000 |
| JP | 2001-284712 | 10/2001 |
| JP | 2003-152272 | 5/2003 |
| KR | 1998-058444 | 10/1998 |
| KR | 1020020091635 | 12/2002 |
| KR | 1020060064476 | 6/2006 |

* cited by examiner

*Primary Examiner*—Minsun Harvey
*Assistant Examiner*—Xnning Niu
(74) *Attorney, Agent, or Firm*—Ladas & Parry LLP

(57) ABSTRACT

Provided is a distributed feedback semiconductor laser structure including: a first clad layer; a first ridge waveguide formed on the first clad layer; an active layer formed on the first ridge waveguide; a second ridge waveguide formed on the active layer; a second clad layer formed on the second ridge waveguide; an ohmic contact layer formed on the second clad layer; and a plurality of gratings formed in at least one of the first and second clad layers, making a predetermined angle with the first ridge waveguide or the second ridge waveguide, and periodically arranged in a longitudinal direction of the first or second ridge waveguide. As a result, a general hologram lithography process capable of mass production is applied to the present invention so that process time can be reduced. Also, a distributed feedback semiconductor laser structure using a quantum-dot active layer that does not require an additional process for obtaining a pure single-wavelength is provided.

9 Claims, 2 Drawing Sheets

SEMICONDUCTOR LASER STRUCTURE INCLUDING QUANTUM DOT

CROSS-REFERENCE TO RELATED APPLICATION

This application claims priority to and the benefit of Korean Patent Application Nos. 2005-117714, filed Dec. 5, 2005, and 2006-84913, filed Sep. 5, 2006, the disclosures of which are incorporated herein by reference in their entirety.

BACKGROUND

1. Field of the Invention

The present invention relates to a semiconductor laser structure, and more particularly, to a semiconductor laser structure in which a ridge waveguide and a grating are designed to form a predetermined angle to thereby obtain a pure single-wavelength laser.

2. Discussion of Related Art

Generally, a distributed feedback semiconductor laser structure is used to obtain a single-wavelength laser beam. The distributed feedback semiconductor laser structure includes an active layer, clad layers formed on and under the active layer, and gratings formed on and under the clad layers and having a pitch corresponding to an integer multiple of ½ a desired wavelength (n$\lambda$/2, n=1, 2, 3 . . . ). However, even when the distributed feedback semiconductor laser structure having the above-described structure is manufactured, a beam having two or more wavelengths is emitted. Therefore, it is not easy to obtain a pure single wavelength.

A semiconductor laser structure invented to overcome the above problems is described below. FIG. 1 schematically illustrates a conventional semiconductor laser structure having a grating structure. Referring to FIG. 1, the conventional semiconductor laser structure 100 includes a clad layer 110, an active layer 120 formed on the clad layer 110, upper and lower light guide layers 130 and 135 formed on and under the active layer 120, and a plurality of gratings 140 formed on the upper light guide layer 135. The plurality of gratings 140 have a period corresponding to an integer multiple of ½ a wavelength (($\lambda$n/2), n=1, 2, 3 . . . ), and include in their structure a region ($\Delta\Phi$) that varies by a length of one-quarter of a wavelength. $\Delta\Phi$ may be represented by (($\lambda$/2)n+$\lambda$/4, n=1, 2, 3 . . . ).

However, the semiconductor laser structure including the above-described grating structure disturbs a beam amplified in the direction of a resonant axis. Accordingly, when the above-described semiconductor structure is used, only a beam having a single wavelength remains, and a beam having a different wavelength is eliminated to thereby emit a laser beam having a pure single wavelength.

However, to produce a phase shift in a region of the grating structure as described above, since it is not easy to use a hologram lithography process using a general interference fringe, additional processes are required.

FIG. 2 schematically illustrates another conventional semiconductor laser structure having a grating structure. The semiconductor laser structure 200 of FIG. 2 includes an InP substrate 210, diffraction gratings 220 formed on the InP substrate 210, a first light guide 230 formed on the InP substrate 210, an active layer 240 formed on the first light guide 230, a second light guide 235 formed on the active layer 240, an InP clad layer 260 formed on the second light guide 235, an absorption type diffraction grating layer 270 formed in the InP clad layer 260, and an InGaAs layer 280 formed on the InP clad layer 260. The semiconductor laser structure 200 of FIG. 2 having the above-described structure is provided to overcome the above problems (the problems described with reference to FIG. 1) that it is difficult to use the hologram lithography process, which has a structure capable of using a conventional hologram method and producing a phase shift.

However, to form the above-described structure, a lithography process is additionally required in spite of using the conventional hologram method, and a precise process for adjusting the positions is required to respectively install diffraction gratings, i.e., the gratings on and under the active layer. In addition, when quantum dots are used in the active layer of the semiconductor laser structure, due to mismatch between the quantum dots, a multilayer structure and a long resonant axis are required so that the semiconductor laser obtains sufficient outputs, which results in multiple-wavelength oscillation.

SUMMARY OF THE INVENTION

The present invention is directed to a semiconductor laser structure, in which a longitudinal direction of a ridge waveguide is formed to make a predetermined angle with gratings so that a laser having a pure single-wavelength is obtained using destructive interference of a beam.

One aspect of the present invention provides a semiconductor laser structure including: a first clad layer; a first ridge waveguide formed on the first clad layer; an active layer formed on the first ridge waveguide; a second ridge waveguide formed on the active layer; a second clad layer formed on the second ridge waveguide; an ohmic contact layer formed on the second clad layer; and a plurality of gratings formed in at least one of the first and second clad layers, making a predetermined angle with the first ridge waveguide or the second ridge waveguide, and periodically arranged in a longitudinal direction of the first or second ridge waveguide.

An angle between the gratings and the ridge waveguide may be represented by $$\theta = \tan^{-1}\left(\frac{2W}{\lambda}\right),$$

where W denotes a resonance amplitude (width) of the ridge waveguide, and $\lambda$ denotes a wavelength.

A period $\tau$ of the gratings may be represented by $$\tau = \frac{\lambda}{2}n$$

$(n = 1, 2, 3, \ldots )$.

The active layer may include at least one quantum dot.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

A semiconductor laser structure according to exemplary embodiment of the present invention will be described in detail with reference to the accompanying drawings.

Figure 1:
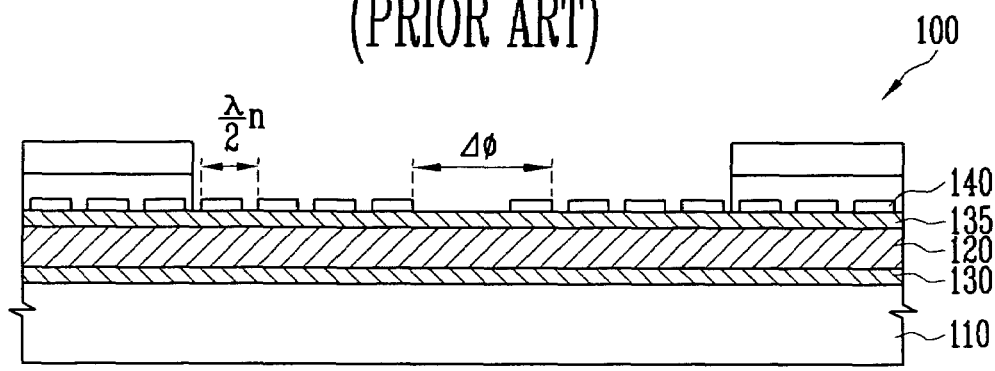
FIG. 1 schematically illustrates a conventional semiconductor laser structure having a grating structure.
Figure 2:
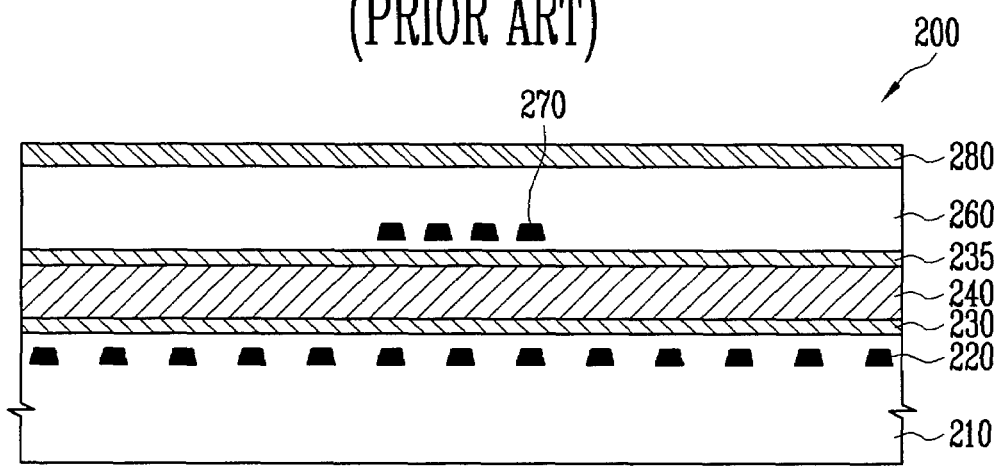
FIG. 2 schematically illustrates another conventional semiconductor laser structure having a grating structure.
Figure 3:
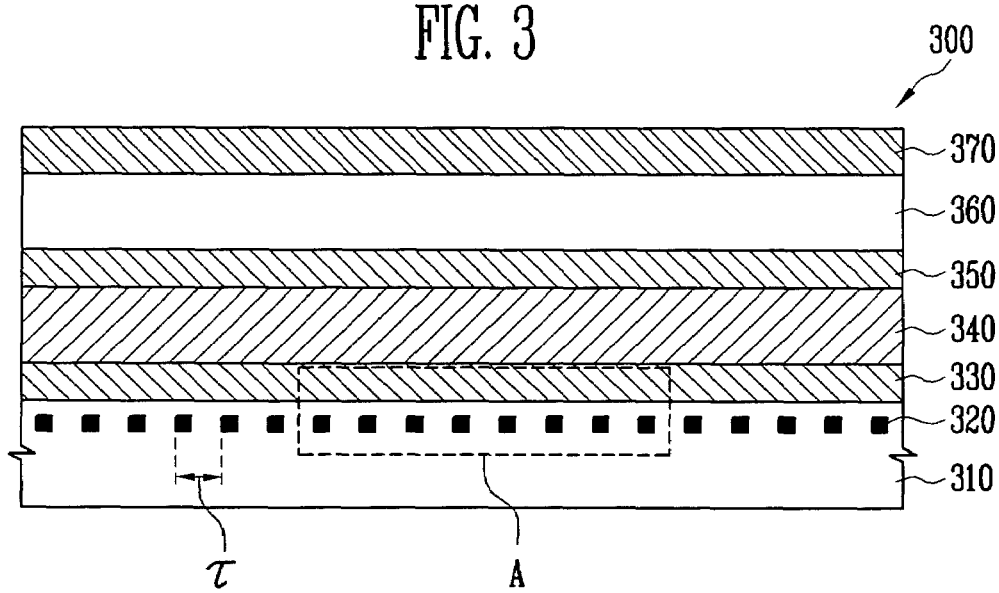
FIG. 3 illustrates a semiconductor laser structure including gratings according to an exemplary embodiment of the present invention.

FIG. 3 illustrates a semiconductor laser structure including gratings according to an exemplary embodiment of the present invention. The semiconductor laser structure 300 disclosed in FIG. 3 is a distributed feedback type laser thin film structure that includes an active layer 340 including quantum dots (not shown), and gratings 320.

Referring to FIG. 3, the distributed feedback semiconductor laser structure 300 sequentially includes a lower clad layer 310, a plurality of gratings 320 formed in the lower clad layer 310, a lower ridge waveguide 330, an active layer 340, an upper ridge waveguide 350, an upper clad layer 360, and an ohmic contact layer 370.

The lower clad layer 310 and the upper clad layer 360 may be formed of a $p^+$ or $n^+$ clad layer. When the lower clad layer 310 is a $p^+$ clad layer, the upper clad layer 360 is formed of an $n^+$ clad layer. In other words, the lower clad layer 310 and the upper clad layer 360 have an opposite conductivity type to each other. Generally, the gratings 320 formed in the lower clad layer 310 may use a distributed feedback separated confinement heterostructure (DFB SCH). Here, the period of the gratings 320 may be an integer multiple of $\tau=(\lambda/2)n$.

To manufacture the above-described distributed feedback semiconductor laser structure 300 having a single-wavelength, a resonant axis which is the lower ridge waveguide 330 should be configured in a direction in which cleaving is easy, and the gratings 320 are arranged to make a predetermined angle with the resonant axis, i.e., the lower ridge waveguide 330. To obtain a pure single-wavelength using the gratings 320 and the ridge waveguide 330, the gratings 320 should simultaneously satisfy a period corresponding to an integer multiple of $\lambda/2$ in the direction of the resonant axis, and a $\lambda/4$ phase shift. A relationship between the gratings 320 and the lower ridge waveguide 330 for simultaneously satisfying the period corresponding to an integer multiple of $\lambda/2$ and the $\lambda/4$ phase shift will be described in detail with reference to FIG. 4.

Figure 4:
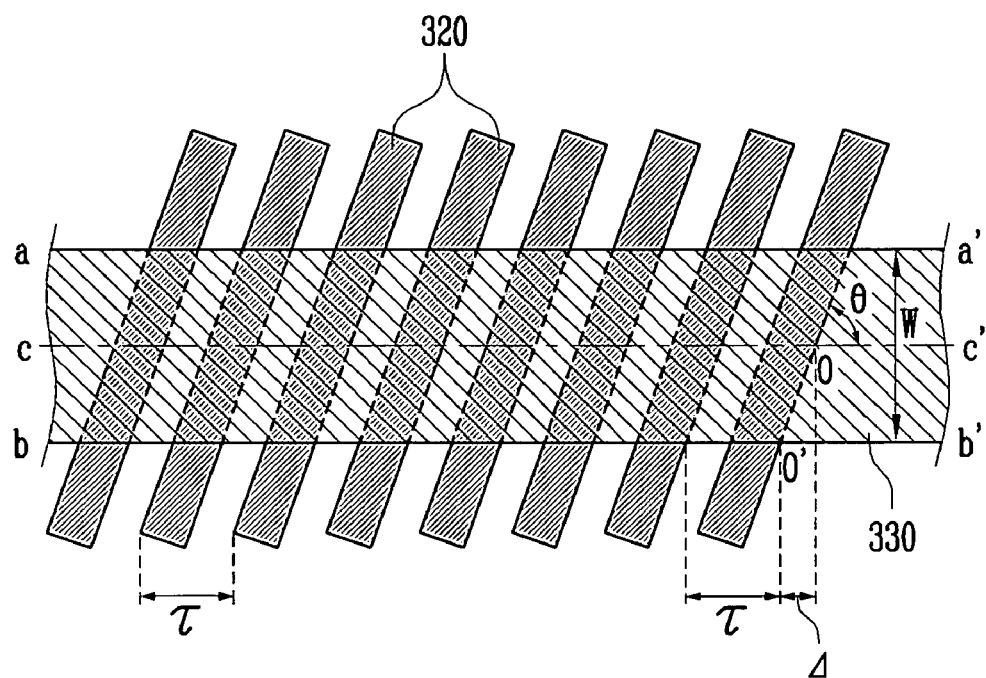
FIG. 4 is an enlarged top view of gratings and a ridge waveguide disclosed in a region A of FIG. 3.

FIG. 4 is an enlarged top view of the gratings 320 and the ridge waveguide 330 in a region A of FIG. 3. Referring to FIG. 4, lines aa' and bb' denote a part of both lengthwise ends of the lower ridge waveguide 330, and W denotes a width of the lower ridge waveguide 330. The width W may be formed in consideration of an output of a quantum-dot laser. In the present embodiment, the ridge waveguide having a width W of 5 μm or more is disclosed. This is because an angle θ between the gratings 320 and ridge waveguide 330 should be larger to make a wavelength difference equal to ½ a resonant wavelength when the width of the ridge waveguide is 5 μm or less. Meanwhile, the width of the ridge waveguide may be adjusted according to a design of a semiconductor laser structure. In addition, when the width of the ridge waveguide is less than 5 μm, the ½ wavelength difference may not be obtained even by increasing the angle θ. Also, the length of the ridge waveguide 330 may be formed taking into account the output of the quantum-dot laser included in the active layer 340, and given the present state of the art, may be formed to have a length of about 0.5 mm or more.

Line cc' disclosed in FIG. 4 denotes a center-line of the width W of the lower ridge waveguide. $\theta(\neq 90°)$ denotes an angle between the center-line cc' of the ridge waveguide 330 and the gratings 320, and $\tau=(\lambda/2)n$ (n=1, 2, 3) denotes a period (from a start point of a grating to another start point of another grating) of the gratings 320 in the direction of the center-line cc'. In addition, Δ denotes a path difference (a phase difference) between a laser beam on the center line cc' and a laser beam on a line bb', an edge of the lower ridge waveguide 330.

To obtain a desired wavelength, the period τ of the gratings 320 of FIG. 4 should be an integer multiple of $\lambda/2$, which is equal to a period of a grating that does not make an angle with a center-line of a general ridge waveguide and is vertically formed with the ridge waveguide. To obtain a single-wavelength, the period τ and the $\lambda/4$ phase shift should be satisfied. Here, a path difference should be $\lambda/4$, the path difference Δ between the laser beam on the center-line cc' and an end (aa' or bb') of the ridge waveguide 330.

Specifically, a general laser beam is an electromagnetic wave having the same wavelength and phase, in which an interference phenomenon occurs when a little path difference (or a phase difference) is provided, and intensity of the beam is largely increased or extinguished (interference) according to the phase difference. General single slit diffraction (whereby a location on the diffraction pattern is bright or dark depending on a path difference between diffracted light starting from the middle of the slit and diffracted light starting from an edge of the slit) is used in the present invention. Thus, laser light on the center-line cc' corresponds to light on the edge line bb', which is the same as the single slit diffraction principle. And, light in the direction of ca corresponds to W/2 light in the direction of ba. Consequently, the diffracted light undergoes interference with a phase difference of $\lambda/4$.

Accordingly, a main feature of the present invention is application of the above principle to the semiconductor laser structure including the ridge waveguide. Also, an angle between the gratings and the ridge waveguide should correspond to a $\lambda/4$ phase shift, and the period of the gratings with respect to the resonant axis should correspond to an integer multiple of $\lambda/2$. The appropriate angle between the gratings and the ridge waveguide can be obtained as shown below.

First, a path difference of a light passing between o and o' in FIG. 4 is Δ, as given by the following formulae:

$$\Delta = W/(2 \tan \theta) \quad \text{Formula (1)}$$

$$\Delta = \lambda/4 \quad \text{Formula (2)}$$

Combining Formulae (1) and (2) yields:

$$\theta = \tan^{-1}(2W/\lambda) \quad \text{Formula (3)}$$

Formula (3) expresses angle θ between the center-line of the ridge waveguide 330 and the gratings 320 in terms of the wavelength λ in the lower ridge waveguide 330 which is a laser resonant axis. That is, when the wavelength in air is λ', the wavelength λ in the lower ridge waveguide 330 is equal to λ'/n (n denotes effective refractive index of the lower ridge waveguide 330).

Consequently, while the period of the gratings 320 in the direction of the central axis is the same as in the conventional art, to cause a path difference of $\lambda/4$, the angle given by Formula (3) should be made with respect to the center-line.

Figure 5:
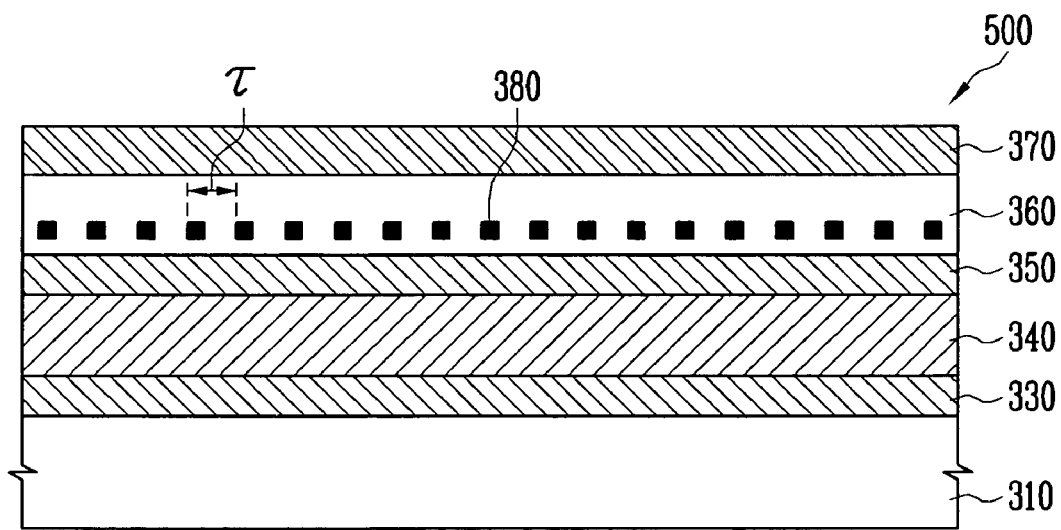
FIG. 5 illustrates a semiconductor laser structure including gratings according to another exemplary embodiment of the present invention.

FIG. 5 illustrates a semiconductor laser structure including gratings according to another exemplary embodiment of the present invention. Referring to FIG. 5, a distributed feedback semiconductor laser structure 500 includes a lower clad layer 310, a lower ridge waveguide 330, an active layer 340, an upper ridge waveguide 350, an upper clad layer 360, a plurality of gratings formed on the upper clad layer 360, and an ohmic contact layer 370 stacked in that order. The semiconductor laser structure 500 of FIG. 5 has the same components and operations as the semiconductor laser structure of FIG. 3 except for the gratings 380 that are formed on the upper clad layer 360.

The gratings 380 shown in FIG. 5 are periodically arranged in the longitudinal direction of the upper ridge waveguide 350. Also, each grating 380 is arranged to make a predetermined angle with the upper ridge waveguide 350 (refer to Formula (3)) so that the requirements of a period corresponding to an integer multiple of $\lambda/2$ and a $\lambda/4$ phase shift are simultaneously satisfied.

As described above, a semiconductor laser structure including quantum dots can be fabricated by the same conventional method used to fabricate a distributed feedback ridge waveguide structure. Also, since no additional processes are required, a simple change of mask can yield a laser beam having a pure single wavelength. In other words, since a hologram process using a conventional interference pattern is used, cost can be reduced and yield improved without need of further precision.

In addition, a single wavelength can be obtained in the present invention so that a high-output single wavelength laser can be manufactured. This was impossible based on the conventional semiconductor laser structure in which a ridge waveguide has a large width and longitudinal resonant axis.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A semiconductor laser structure, comprising:
    a first clad layer;
    a first ridge waveguide having a width W formed on the first clad layer, the width W corresponding to a resonance amplitude, wherein "0" and W are the two end positions of a width of the first ridge waveguide, and a lengthwise line along W/2 is the centerline of the first ridge waveguide, and a resonance axis is formed along the lengthwise direction of the first ridge waveguide;
    an active layer formed on the first ridge waveguide;
    a second ridge waveguide formed on the active layer;
    a second clad layer formed on the second ridge waveguide;
    an ohmic contact layer formed on the second clad layer; and
    a plurality of gratings formed in at least the first clad layer, making a predetermined angle with respect to the resonance axis of the first ridge waveguide such that the phase shift between the cross section of a grating and the width "0" W and the cross section of the corresponding grating and the width W/2 is $\lambda/4$, wherein a single-wavelength output is generated by destructive interference of an output of the semiconductor laser structure along "0" or W and an output of the semiconductor laser structure along W/2, wherein the gratings are periodically arranged in a longitudinal direction of the first ridge waveguide,
    wherein $\theta = \tan^{-1}(2W/\lambda)$, where the width W also denotes a resonance amplitude of the first ridge waveguide and $\lambda$ denotes a wavelength.

2. The semiconductor laser structure of claim 1, wherein a period $\tau$ of the gratings is represented by $\tau = (\lambda/2)*n (n=1, 2, 3 \ldots )$.

3. The semiconductor laser structure of claim 1, wherein the active layer comprises at lease one quantum dot.

4. The semiconductor laser structure of claim 1, wherein the width of the first ridge waveguide W is 5 μm or more.

5. The semiconductor laser structure of claim 1, wherein the length of the first ridge wave guide is 0.5 mm or more.

6. A semiconductor laser structure, comprising:
    a first clad layer;
    a first ridge waveguide formed on the first clad layer;
    an active layer formed on the first ridge waveguide;
    a second ridge waveguide having a width W formed on the active layer, wherein "0" and W are the two end positions of the width of the first ridge waveguide such that the centerline of the second ridge waveguide is defined along W/2;
    a second clad layer formed on the second ridge waveguide;
    an ohmic contact layer formed on the second clad layer; and
    a plurality of gratings formed in at least the second clad layer along a predetermined angle $\theta$ with respect to the second ridge waveguide, wherein a single-wavelength output is generated by destructive interference of an output of the semiconductor laser structure along "0" or W and an output of the semiconductor laser structure along W/2,
    wherein the gratings are periodically arranged in a longitudinal direction of the second ridge waveguide, and
    wherein $\theta = \tan^{-1}(2W/\lambda)$, where the width W also denotes a resonance amplitude of the second ridge waveguide and $\lambda$ denotes a wavelength.

7. The semiconductor laser structure of claim 6, wherein a period $\tau$ of the gratings is $\tau = (\lambda/2)*n$ where n is a positive integer greater than or equal to 1.

8. The semiconductor laser structure of claim 6, wherein the active layer comprises at lease one quantum dot.

9. The semiconductor laser structure of claim 6, wherein the width of the second ridge waveguide W is 5 μm or more.

* * * * *